United States Patent [19]
Bayan et al.

[11] Patent Number: 5,494,758
[45] Date of Patent: Feb. 27, 1996

[54] ARTICLE MANUFACTURED BY AN ION-BEAM-ASSISTED-DEPOSITION PROCESS

[75] Inventors: Ghawamedin Bayan, Beavercreek; John G. Martin, Yellow Springs; Roger A. Cassell, Springfield, all of Ohio

[73] Assignee: Vernay Laboratories, Inc., Yellow Springs, Ohio

[21] Appl. No.: 258,450

[22] Filed: Jun. 10, 1994

[51] Int. Cl.⁶ ........................ B32B 15/04
[52] U.S. Cl. .............. 428/457; 428/192; 428/194; 428/458; 428/460; 428/461; 428/463; 428/689
[58] Field of Search .............. 401/198; 428/546, 428/457, 492, 460, 411.1, 192, 194, 457, 458, 460, 461, 463, 689

[56] References Cited

U.S. PATENT DOCUMENTS

| | | | |
|---|---|---|---|
| 3,711,020 | 1/1973 | Zelna | 239/1 |
| 4,743,308 | 5/1988 | Sioshansi et al. | 148/4 |
| 4,942,998 | 7/1990 | Horvath et al. | 228/102 |
| 5,201,314 | 4/1993 | Bosley et al. | 128/662.02 |
| 5,223,309 | 6/1993 | Farivar et al. | 427/525 |
| 5,236,509 | 8/1993 | Sioshansi et al. | 118/719 |

OTHER PUBLICATIONS

P. Sioshansi, Medical Applications for Ion Beam Processes, pp. 15–19, 1987, Nuclear Instruments and Methods in Physics Research.

James K. Hirvonen, Surface Modification of Polymers and Ceramics, pp. 20–23, Reprinted from May 1986 issue of Advanced Materials & Processes Magazine.

Shimoyama Patent Abstracts of Japan vol. 17, No. 516, Sep. 17, 1993.

*Primary Examiner*—Patrick J. Ryan
*Assistant Examiner*—William A. Krynski
*Attorney, Agent, or Firm*—Biebel & French

[57] ABSTRACT

An article is provided manufactured by an ion-beam-assisted-deposition process. The article includes a polymeric element adapted to releasably engage a contact surface. The polymeric element is provided with a surface layer bonded to a surface of the polymeric element through an ion-beam-assisted-deposition process in order to reduce the tackiness of the polymeric material.

22 Claims, 2 Drawing Sheets

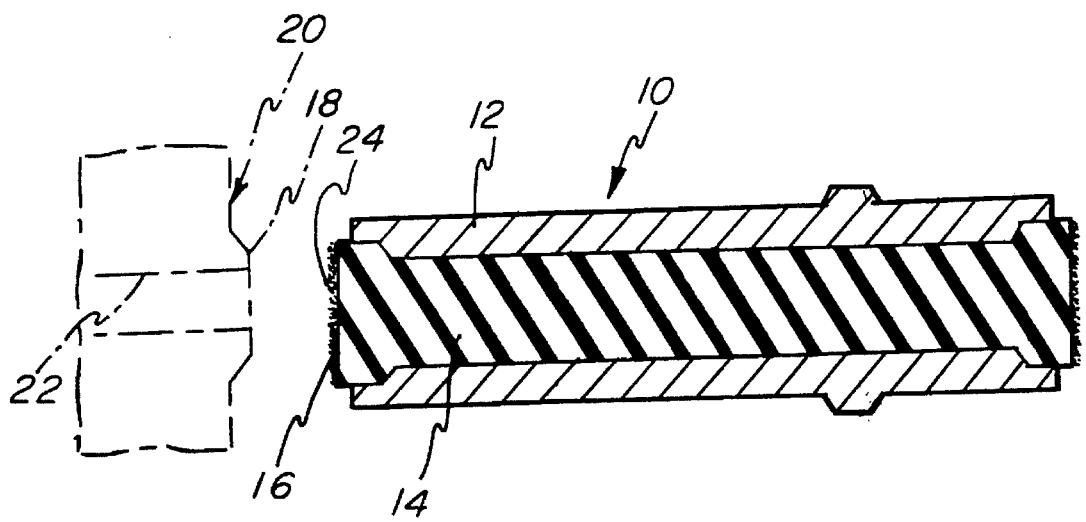
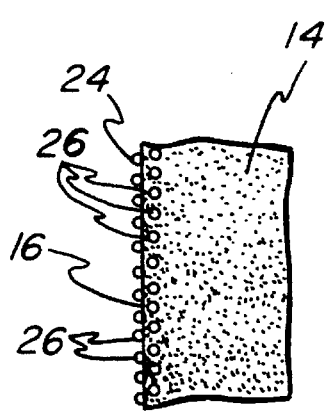
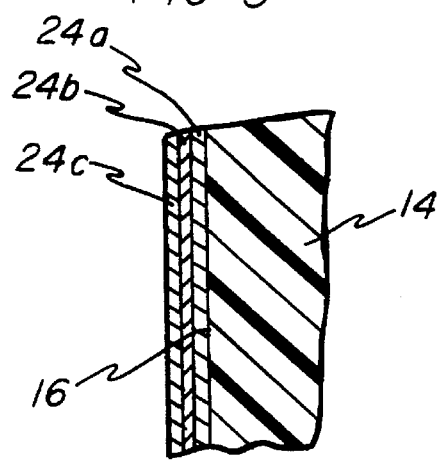

ARTICLE MANUFACTURED BY AN ION-BEAM-ASSISTED-DEPOSITION PROCESS

BACKGROUND OF THE INVENTION

This invention relates generally to an article manufactured by an ion-beam-assisted-deposition process, and more particularly, to an article generally in the form of a plunger including a polymeric element adapted to engage a contact surface wherein the polymeric element is provided with a surface layer formed by an ion-beam-assisted-deposition process.

Polymer tipped metallic armatures of various configurations are commonly used in electric solenoid assemblies used in fluid control applications. A typical armature is formed with a cylindrical metal body or insert which has a cavity or hole formed lengthwise in one end or which may extend through the entire length of the insert. An elastomeric element is mounted within the hole and may extend beyond the end of the metal insert or it may have an end surface which is recessed behind the end surface of the insert. The elastomeric tip formed at the end of the armature insert provides an effective means for forming a seal with another surface of the solenoid assembly to prevent fluid leaks, as well as forming a resilient contact surface for avoiding excessive wear between the sealing surfaces of the solenoid. Examples of such devices are disclosed in U.S. Pat. Nos. 4,970,484 and 5,002,835, assigned to the assignee of the present invention.

In another example of an article in the form of a resilient tipped plunger, a rigid body is provided with a resilient tip formed of an elastomeric material, such as rubber, to define a needle valve which is adapted to seal an orifice. Examples of such plungers are shown in U.S. Pat. Nos. 3,155,367 and 4,525,910, both assigned to the assignee of the present invention, wherein a resilient conicle tip is mounted to the end of an elongated rigid metal body.

One problem encountered with the above described plunger type armature and needle valve assemblies results from the inherent tackiness of the elastomeric element wherein the tackiness of the element creates an adherence force between the element and a contact surface defined by a seat engaged with the element. Thus, the tackiness of the elastomeric element results in a force holding the element in engagement with the seat such that art increased force is required to separate the element from the seat. It is therefore desirable to provide an article incorporating a polymeric sealing element wherein the tackiness of the surface of the element is decreased while maintaining the desirable resilient or flexible characteristics of the element.

SUMMARY OF THE INVENTION

The present invention provides an article of manufacture which is designed to satisfy the aforementioned needs.

In one aspect of the invention, an article of manufacture is provided comprising a polymeric element adapted to releasably engage a contact surface, and a surface layer defined on the polymeric element to reduce a force resisting separation of the polymeric element from the contact surface wherein the surface layer is formed by an ion-beam-assisted-deposition process.

In a further aspect of the invention, the surface layer is a metallic layer formed of silver, gold, chromium, nickel, aluminum, copper or titanium or a combination of these, and is preferably titanium.

In another aspect of the invention, the surface layer is a non-metallic layer formed of $SiO_2$, PTFE-like material, diamond-like material or polymeric materials.

In yet another aspect of the invention, the article includes a rigid body wherein the polymeric element is supported on the rigid body and the surface layer is defined on an exposed surface of the polymeric element. The article preferably is in the form of an armature for engaging a seat defining the contact surface, or in the form of a needle valve for engaging within an orifice in a seat defining the contact surface.

In a further aspect of the invention, the polymeric element and the surface layer form a flexible engagement surface for engaging the contact surface.

Therefore, it is a primary object of the present invention to provide an article including an polymeric element having a reduced tackiness.

It is a further object of the invention to provide such an article wherein the polymeric element is treated by an ion-beam-assisted-deposition process.

Other objects and advantages of the invention will be apparent from the following description, the accompanying drawings and the appended claims.

BRIEF DESCRIPTION OF THE DRAWINGS

FIG. 1 is a cross-sectional view of an armature, illustrating one form of an article of the present invention;

FIG. 2 is a schematic side elevation, on an enlarged scale, of a fragmentary portion of the article of FIG. 1;

FIG. 3 is a schematic side elevation view, on an enlarged scale, illustrating plural layers provided to the article of FIG. 1;

DETAILED DESCRIPTION OF THE PREFERRED EMBODIMENT

Figure 4:
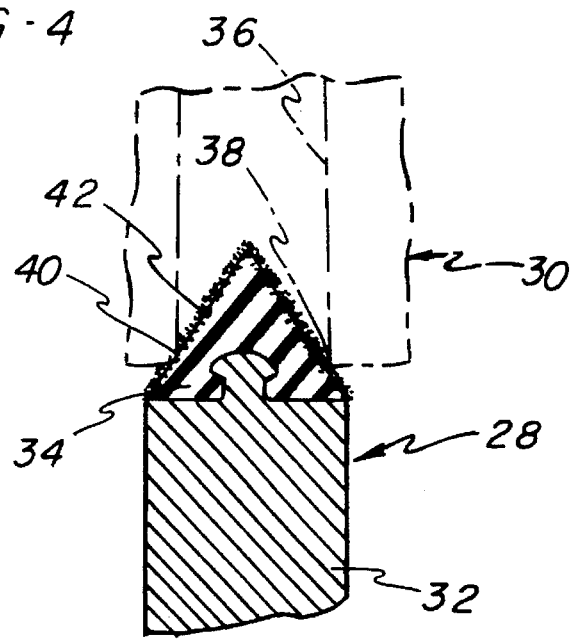
FIG. 4 is a cross-sectional view of a needle valve illustrating another configuration for the article of the present invention.

The present invention relates to an article comprising an element formed of an polymeric material having inherent tackiness wherein the inherent tackiness on a surface of the element is reduced through an ion-beam-assisted-deposition (IBAD) process. Systems for performing an IBAD process are well known and typically include an ion gun and evaporator disposed adjacent to each other within a vacuum chamber. The ion gun and evaporator are directed toward a target, such as an article of the present invention, to thereby effect a desired coating on the article. More specifically, in an IBAD system, physical vapors are constantly emanating from the evaporator and are caused to be deposited on the surface of the article to be coated. In addition, an ion beam, for example an ion beam of argon, neon or helium, is directed onto particular surface locations of the article to thereby embed the material forming the physical vapor into the surface of the article whereby a region of interlocking is produced to form a substrate which is interlinked with the material of the article surface. In addition, the IBAD system may be provided with a monitor for constantly monitoring the deposition of a film coating on the article surface wherein the monitor measures the thickness, consistency, uniformity and any other coating characteristics which are desired to be controlled. For a description of a typical IBAD process see U.S. Pat. Nos. 5,236,509 to Sloshansi et al. and 4,743,308 to Sloshansi et al., the disclosures of which are incorporated herein by reference.

In addition, it should be noted that a satisfactory IBAD process for producing the article of the present invention is the process performed under various trademarks such as SPI-ARGENT and SPI-MET, which are commercially available from Spire Corporation of Bedford, Mass.

Referring to FIG. 1, one form of the article of the present invention is illustrated as a plunger element in the form of an armature 10 including a rigid metal body for insert 12 and a polymeric element 14. The polymeric element 14 may be an elastomeric material and preferably has predetermined resilient characteristics and may be formed of rubber or any one of a variety of polymer compounds such as, for example, Buna N (butadiene-acrylonitrile copolymer), EPDM (ethylene propylene diene terpolymer), fluoroelastomers such as Viton and Fluorel, Silicone or thermoplastic elastomers.

The polymeric element 14 includes an exposed engagement surface 16 which is adapted to engage a contact surface 18 defined on a valve seat 20 to control flow of fluids through an aperture 22 extending through the seat 20. It should be noted that the polymeric element 14 is resilient or flexible such that the engagement surface 16 will flex slightly as it engages the contact surface 18. However, upon contacting the contact surface 18, the natural tackiness of the material forming the element 14 tends to cause the engagement surface 16 to adhere to the contact surface 18 with a certain force resisting separation of the armature 10 from the seat 20. In accordance with the present invention, a coating or surface layer 24 is provided to the engagement surface 16 by the IBAD process whereby the natural tackiness of the engagement surface 16 is eliminated. Thus, the coating or surface layer 24 acts to significantly decrease any adhesion forces acting to resist separation of the engagement surface 16 from the contact surface 18.

Referring to FIG. 2, an enlarged view of a section of the polymeric element 14 at the engagement surface 16 is illustrated wherein atoms of the coating material are illustrated by circles 26. It can be seen that the atoms 26 are located both within the polymeric element 14 and on the exterior adjacent to the engagement surface 16 such that the coating 24 is interlinked with the material forming the polymeric element 14 to produce a secure bond for the surface layer 24 which prevents separation of the surface layer 24 from the polymeric element 14 during use of the armature 10. In addition, it should be noted that the polymeric element 14 has a predetermined resiliency or flexibility prior to the coating operation forming the surface layer 24 and that subsequent to formation of the surface layer 24 on the engagement surface 16 element 14 has substantially the same flexibility as the predetermined flexibility. In other words, subsequent to formation of the surface layer 24, the engagement surface 16 provides a flexible surface for engaging with the contact surface 18 whereby the engagement surface 16 continues to provide the advantages of providing a seal which eliminates leakage of fluids and which reduces the wear between contacting surfaces.

Both metallic and non-metallic coatings have been considered for use in the present invention. Among metallic coatings considered to be acceptable for the present invention are silver, gold, chromium, nickel, aluminum, copper and titanium either singly or in combination. Non-metallic materials considered to be acceptable for the coating of the present invention are $SiO_2$, PTFE-like materials, diamond-like materials and polymeric materials. In the preferred embodiment, the coating material is preferably formed by titanium atoms which form the evaporant for coating the engagement surface 16. It has been found that titanium exhibits the desired wear and bonding characteristics when used in combination with the polymeric element 14.

In a typical process forming the surface layer 24 on the polymeric element 14, the armature 10 is placed in the chamber of an IBAD system and the chamber is evacuated to less than $10^{-4}$ torr. The engagement surface 16 is cleaned or prepared by a solvent or/and in a vacuum, for example by bombarding the surface 16 with argon or other inert gas ions. The evaporator is then energized to fill the chamber with a vapor which begins coating the polymeric element 14. The ion gun is then energized to drive the atoms 26 into the engagement surface 16 whereby the surface layer 24 is formed at a preferentially selected location on the armature 10. The coating process is continued until a desired thickness is reached, such as approximately 0.05–5.0 microns and possibly as low as 0.01 microns. It should be noted that the desired thickness of the surface layer 24 is preferably formed by creating a succession of monolayers until the desired thickness is obtained. FIG. 3 diagrammatically illustrates the elastomeric element 14 provided with a succession of monolayers 24a, 24b and 24c to form a dense surface coating for the engagement surface 16.

Referring to FIG. 4, an alternative configuration for the article of the present invention is illustrated as a plunger element in the form of a needle valve 28 for cooperating with a valve seat 30. The needle valve 28 includes a rigid metal body 32 supporting a conicle polymeric element 34 such as may be used to control flow in a fuel line. The polymeric element 34 may be formed of a material similar to those described above with regard to the polymeric element 14 and is adapted to engage within an orifice 36 extending through the seat 30 and defining a contact surface 38. Polymeric element 34 includes an engagement surface 40 which is provided with a surface layer 42. The surface layer 42 is preferably formed in accordance with an IBAD process as described above with regard to the armature 10.

Figure 5:
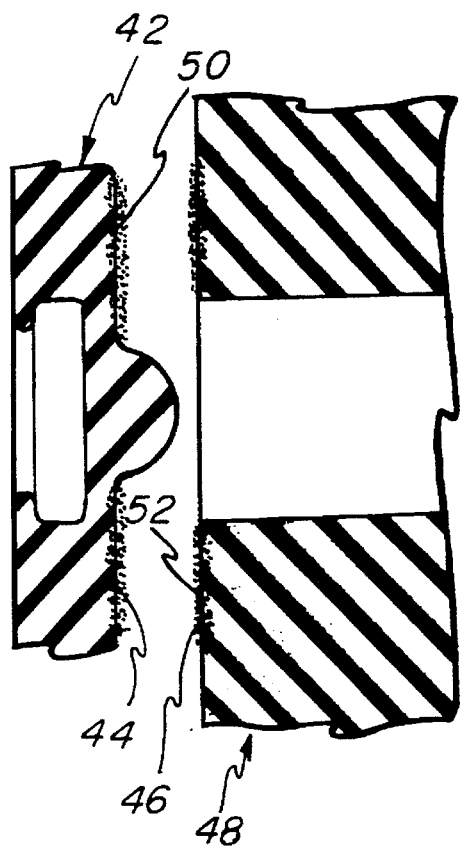
FIG. 5 is a cross-sectional view of a further configuration for the article of the present invention.

Referring to FIG. 5, another configuration for the article of the present invention is illustrated in the form of a polymeric element 42 for mounting on the end of a plunger element (not shown) to form an armature. The polymeric element 42 includes an engagement surface 44 for engaging a contact surface 46 on a seat 48. As in the previous embodiments, the engagement surface 44 is provided with a surface layer 50 formed in accordance with an IBAD process in order to reduce the tackiness of the engagement surface 44. Alternatively, the contact surface 46 of the seat 48, which may be formed of a polymeric material, may be provided with a surface layer 52 formed by an IBAD process in order to reduce the surface attraction between the element 42 and the seat 48.

It should be noted that the use of the IBAD process for providing an engagement surface with reduced tackiness for the article of the present invention provides a benefit over chemical or physical vapor deposition coating systems in that the IBAD process ensures adhesion of the coating material to the surface of the polymeric element. This is due to the ion beam bombardment causing the interface between the surface layer and the polymeric element to be comprised of interlocking molecular linkages resulting in a heterogeneous mix between the surface layer and the polymeric element. Further, it should be noted that certain properties associated with IBAD coatings are highly desirable for the present article. These properties include adense coating free of pinholes, an adherent dense and flexible coating which does not affect the bulk properties of the polymeric element, a highly controllable and adjustable coating, a clean coating which is free of contaminants, and a coating which can be reliably reproduced.

From the above description, it should be apparent that the present invention provides an article manufactured by an IBAD process wherein a polymeric element of the article is provided with the beneficial characteristic of reduced tackiness in order to facilitate operation of the article in various devices. Further, this beneficial characteristic is provided without detrimentally affecting the resilient or flexible characteristics associated with the polymeric element.

While the article herein described constitutes a preferred embodiment of the invention, it is to be understood that the invention is not limited to this precise article, and that changes may be made therein without departing from the scope of the invention which is defined in the appended claims.

What is claimed is:

1. An article of manufacture including a plunger having an engagement surface formed of a polymeric material for releasably engaging a contact surface extending around an aperture whereby fluid flow through the aperture is controlled, the improvement comprising:

a surface layer defined on said engagement surface to reduce a force resisting separation of said engagement surface from said contact surface, and wherein said surface layer is formed on and bonded to said engagement surface by an ion-beam-assisted-deposition process.

2. The article as recited in claim 1 wherein said said plunger comprises an armature for engaging said contact surface.

3. The article as recited in claim 1 wherein said plunger comprises a needle valve for engaging the contact surface.

4. The article as recited in claim 1 wherein said surface layer is a metallic layer or layers of two or more metals.

5. The article as recited in claim 1 wherein said surface layer is a non-metallic layer.

6. The article as recited in claim 1 wherein said engagement surface comprises an elastomeric material.

7. The article as recited in claim 6 wherein said plunger comprises an armature for engaging the contact surface.

8. The article as recited in claim 6 wherein said plunger comprises a needle valve for engaging the contact surface.

9. The article as recited in claim 1 wherein said plunger includes a rigid body and said polymeric material is supported on said rigid body such that said surface layer is defined on an exposed surface of said polymeric material.

10. The article as recited in claim 1 wherein said surface layer is formed from titanium, silver, chromium, nickel, gold, aluminum and copper either singly or in combination.

11. The article as recited in claim 1 wherein said surface layer is formed from one of $SiO_2$ and polymeric materials.

12. The article as recited in claim 1 wherein said surface layer is titanium.

13. The article as recited in claim 1 wherein said surface layer has a thickness between approximately 0.01 microns and 5.0 microns.

14. The article as recited in claim 1 wherein said engagement surface and said surface layer are flexible.

15. An article produced through an ion-beam-assisted-deposition process comprising:

a rigid body;

a polymeric element supported on said rigid body such that said rigid body and said polymeric element define a plunger for moving into engagement with a valve seat, and wherein said polymeric element includes an engagement surface, and including a surface layer formed on and bonded to said engagement surface through said ion-beam-assisted deposition process.

16. The article as recited in claim 15 wherein said surface layer is formed by an ion-beam-assisted-deposition of metal atoms on said engagement surface.

17. The article as recited in claim 15 wherein said surface layer is formed by an ion-beam-assisted-deposition of non-metallic atoms on said engagement surface.

18. The article as recited in claim 15 wherein said polymeric element comprises an elastomeric material.

19. The article as recited in claim 15 wherein said engagement surface comprises a flexible surface for engaging said valve seat.

20. An article of manufacture including a valve seat having an aperture extending therethrough, said valve seat defining a contact surface formed of a polymeric material, said contact surface being adapted to releasably engage an engagement surface on a plunger whereby fluid flow through the aperture is controlled, the improvement comprising:

a surface layer defined on said contact surface to reduce a force resisting separation of said engagement surface from said contact surface, and wherein said surface layer is formed on and bonded to said contact surface by an ion-beam-assisted-deposition process.

21. The article as recited in claim 20 wherein said surface layer is a metallic layer.

22. The article as recited in claim 20 wherein said surface layer is a non-metallic layer.

* * * * *